(12) United States Patent
Kuriyama et al.

(10) Patent No.: US 7,738,299 B2
(45) Date of Patent: Jun. 15, 2010

(54) ERASE DISCHARGE CONTROL METHOD OF NONVOLATILE SEMICONDUCTOR MEMORY DEVICE

(75) Inventors: Masao Kuriyama, Yokohama (JP); Makoto Hirano, Yokohama (JP); Hiroki Murakami, Yokohama (JP); Yuichiro Nakagaki, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 55 days.

(21) Appl. No.: 11/819,172

(22) Filed: Jun. 26, 2007

(65) Prior Publication Data
US 2008/0123434 A1 May 29, 2008

(30) Foreign Application Priority Data
Jun. 26, 2006 (JP) ............... 2006-175540

(51) Int. Cl.
G11C 11/34 (2006.01)
(52) U.S. Cl. ............... 365/185.18; 365/185.25; 365/185.26; 365/185.27; 365/185.29; 365/185.33
(58) Field of Classification Search ............ 365/185.18, 365/185.25, 185.26, 185.27, 185.28, 185.29, 365/185.33
See application file for complete search history.

(56) References Cited

U.S. PATENT DOCUMENTS

| | | | | | |
|---|---|---|---|---|---|
| 4,698,787 | A | * | 10/1987 | Mukherjee et al. | 365/185.29 |
| 5,265,059 | A | * | 11/1993 | Wells et al. | 365/185.27 |
| 6,353,556 | B2 | * | 3/2002 | Chen et al. | 365/185.29 |
| 6,504,765 | B1 | * | 1/2003 | Joo | 365/185.29 |
| 6,510,084 | B2 | * | 1/2003 | Ha | 365/185.29 |
| 6,646,925 | B2 | * | 11/2003 | Kaya et al. | 365/185.29 |
| 7,193,902 | B2 | * | 3/2007 | Lee | 365/185.29 |
| 7,200,047 | B2 | * | 4/2007 | Gualandri et al. | 365/185.29 |
| 7,313,029 | B2 | * | 12/2007 | Shen et al. | 365/185.29 |
| 7,372,738 | B2 | * | 5/2008 | Choi et al. | 365/185.29 |
| 7,397,699 | B2 | * | 7/2008 | Trinh | 365/185.18 |
| 7,400,538 | B2 | * | 7/2008 | Pikhay et al. | 365/185.29 |

FOREIGN PATENT DOCUMENTS

| | | |
|---|---|---|
| JP | 2002-324858 | 11/2002 |
| KR | 1020040008526 A | 1/2004 |
| KR | 1020050009141 A | 1/2005 |

* cited by examiner

*Primary Examiner*—Trong Phan
(74) *Attorney, Agent, or Firm*—Harness, Dickey & Pierce, PLC

(57) ABSTRACT

According to an example embodiment, an erase discharge method may include drawing charges accumulated in a floating gate of a floating gate type field effect transistor into a semiconductor substrate to perform an erase operation by applying a first voltage to a word line, a second voltage to an N-well and a P-well, and/or opening a bit line and a ground line. The word line may be grounded, and a discharge transistor connected to the bit line may be turned on. The N-well and the P-well may be grounded to discharge charges accumulated in the N-well and P-well.

11 Claims, 9 Drawing Sheets

(CONVENTIONAL ART)

ERASE DISCHARGE CONTROL METHOD OF NONVOLATILE SEMICONDUCTOR MEMORY DEVICE

PRIORITY STATEMENT

This application claims priority under 35 U.S.C. §119 to Japanese Patent Application No. 2006-175540, filed on Jun. 26, 2006, in the Japanese Patent Office, the entire contents of which are incorporated herein by reference.

BACKGROUND

FIG. 4 is a block diagram of an example, conventional NOR flash memory device. As shown, a memory cell array MA may be configured with a plurality of word lines WL, a plurality of bit lines BL, and a plurality of transistors Tr (for example, floating gate field effect transistors) forming memory cells. The plurality of transistors Tr may be disposed at intersections of the word lines WL and the bit lines BL. Each of the transistors Tr may include a control gate, a drain, and a source connected to the word line WL, the bit line BL, and a ground line SL, respectively.

A source 106 and a drain 108 of the transistor Tr may be formed in a P-well 104 provided in an N-well 102 of a semiconductor substrate 100, as illustrated in FIG. 5.

A NOR flash memory may be structured such that the memory cells of MOS transistors having a stack gate structure are connected in parallel in a NOR type configuration.

As illustrated in FIG. 4, a row decoder RD may be provided for selecting word lines WL0 through WL1023 of the memory cell array MA, and a column decoder CD may be provided for selecting bit lines BL0 through BL511. Addresses may be transmitted to the row decoder RD and the column decoder CD as internal row address signals and internal column address signals, respectively, through an address control circuit (not shown). Based on a command decoded by a controller (not shown), sequence control including programming and erasing of data may be performed.

A negative voltage boosting circuit 20 may be connected to the row decoder RD through a negative voltage switch 10. The negative voltage boosting circuit 20 may generate a boosted voltage used in programming or erasing data. For example, the boosted voltage may be obtained by boosting a power supply voltage Vcc. A positive voltage boosting circuit 70 may be further provided in the flash memory because a boosted positive voltage may also be used in programming or erasing data. The boosted positive voltage may be supplied to the ground line SL or the P and N-wells 104 and 102 through a source-well voltage control circuit 60.

In addition, a source switch 30 may control connection/disconnection between the source-well voltage control circuit 60 and the ground line SL. Furthermore, a well switching unit 80 having a P-well switch 40 and an N-well switch 50 may control connection/disconnection between the P and N-wells 104 and 102 and the source-well voltage control circuit 60.

FIG. 6 is a plane view illustrating a cell array structure of an example NOR flash memory. FIG. 7 is a sectional view illustrating the structure of the example NOR flash memory of FIG. 6 taken along line X-X'.

As transistors in memory cells progressively shrink in size, capacitances between respective nodes of the memory cells may be changed. For example, the capacitance between a word line connected to a control gate and a bit line connected to a drain may become significantly higher than capacitances of other nodes because the space between a bit line contact and the word line may be reduced.

FIG. 8 is a timing diagram illustrating voltages applied during an erase operation performed in the flash memory device of FIG. 4. An example erase operation will be described below.

The power supply voltage Vcc may be applied to a word line of a cell in a neutral state. At this point, the bit line BL, the ground line SL, the P-well and the N-well may each be grounded. The word line voltage may be set equal to the ground voltage so that a sector including cells to be erased may be unselected. This state may be denoted as ERS set in FIG. 8. A voltage boosted to a level in the range of approximately 5V to approximately 9.5V by the positive voltage boosting circuit 70 of FIG. 5 may be applied to the P-well 104 and the N-well 102 for well charge.

It may take a given amount of time for the voltage to be boosted to reach the voltage level in the range of approximately 5V to approximately 9.5V, and the boosting operation may be performed so that the voltage may gradually increase from the ground voltage level Gnd to reach the voltage level in the range of approximately 5 to approximately 9.5V.

At this point, the ground line SL and the bit line BL, which may be connected to the source and the drain of the memory cell, may be opened, and the PN junction between the substrate and the source and drain regions may be forward biased. Therefore, a current may flow from the substrate to the source and the drain, and a voltage, which may be reduced from the above boosted voltage by a forward bias voltage Vf of the PN junction, may be applied to the bit line BL and the ground line SL.

Subsequently, the negative voltage boosting circuit 20 may operate so that a negative voltage of approximately −9V may be applied to the word line though the row decoder RD. Thus, an erase operation may be performed such that charges accumulated in a floating gate FG of the cell transistor Tr may be put into the semiconductor substrate.

After erasing, a word line discharge and a well discharge may be performed for discharging the negative and positive voltages applied during the erase operation to the ground voltage level. For a word line discharge, the word line may be grounded so that the charges accumulated in the word line are discharged. After the word line discharge, the bit line, the ground line, the P-well and the N-well may be grounded for performing the well discharge. Therefore, charges in the bit line, the ground line, P-well and the N-well may be discharged to ground.

Thereafter, the unselected state of the word line may be terminated, and the word line voltage may return to the neutral state. For example, the word line voltage may return to the power supply voltage Vcc, whereby the erase operation may be completed.

In such an erase operation, because the coupling capacitance between the word line and the bit line may be higher as illustrated in FIGS. 6 and 7, the bit line voltage may become higher due to the overshoot of the bit line voltage when discharging the word line voltage. Consequently, this higher bit line voltage may exceed a breakdown voltage of a component connected to the bit line and cause the component to fail.

SUMMARY

Example embodiments are directed to an erase discharge control method of a flash memory.

An erase discharge control method may be used in conjunction with a nonvolatile memory device including a memory array in which a plurality of cells are arranged in a matrix form. Each of the cells may have a floating gate type field effect transistor, of which a control gate, a drain and a source may be respectively connected to a word line, a bit line and a ground line. The source and drain may be disposed in a P-well provided in an N-well of a semiconductor substrate.

According to an example embodiment, an erase discharge method may include drawing charges accumulated in a floating gate of the floating gate type field effect transistor into the semiconductor substrate to perform an erase operation by applying a first voltage to the word line, a second voltage to the N-well and the P-well, and/or opening the bit line and the ground line. The word line may be grounded, and a discharge transistor connected to the bit line may be turned on. The N-well and the P-well may be grounded to discharge charges accumulated in the N-well and P-well.

The method may also include reducing the second voltage applied to the N-well and the P-well to a voltage level lower than an erase voltage level. Reducing the second voltage may be performed before grounding the word line. Alternatively, reducing the second voltage may be performed simultaneously with grounding the word line. Turning on the discharge transistor may be performed before grounding the word line. The first voltage may be a negative voltage, and the second voltage may be a positive voltage.

According to another example embodiment, an erase discharge control method of a nonvolatile memory device may include drawing charges accumulated in a floating gate of the floating gate type field effect transistor into the semiconductor substrate to perform an erase operation by applying a first voltage to the word line, a second voltage to the N-well and the P-well, and/or opening the bit line and the ground line. The second voltage applied to the N-well and the P-well may be reduced to a voltage level lower than an erase voltage level. The word line may be grounded. Charges accumulated in the word line may be discharged. The N-well and the P-well may be grounded to discharge charges accumulated in the N-well and P-well.

The method may also include turning on a discharge transistor connected to the bit line. Reducing the second voltage may be performed before grounding the word line. Alternatively, reducing the second voltage may be performed simultaneously with grounding the word line. Turning on the discharge transistor may be performed before grounding the word line. The first voltage may be a negative voltage, and the second voltage may be a positive voltage.

According to another example embodiment, an erase discharge control method of a nonvolatile memory device may include drawing charges accumulated in a floating gate of the floating gate type field effect transistor into the semiconductor substrate to perform an erase operation by applying a first voltage to the word line, a second voltage to the N-well and the P-well, and/or opening the bit line and the ground line. The second voltage applied to the N-well and the P-well may be reduced to a voltage level lower than an erase voltage level, grounding the word line, and turning on a discharge transistor connected to the bit line. The N-well and the P-well may be grounded to discharge charges accumulated in the N-well and P-well.

Reducing the second voltage may be performed before grounding the word line. Alternatively, reducing the second voltage may be performed simultaneously with grounding the word line. Turning on the discharge transistor may be performed before grounding the word line. The first voltage may be a negative voltage, and the second voltage may be a positive voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
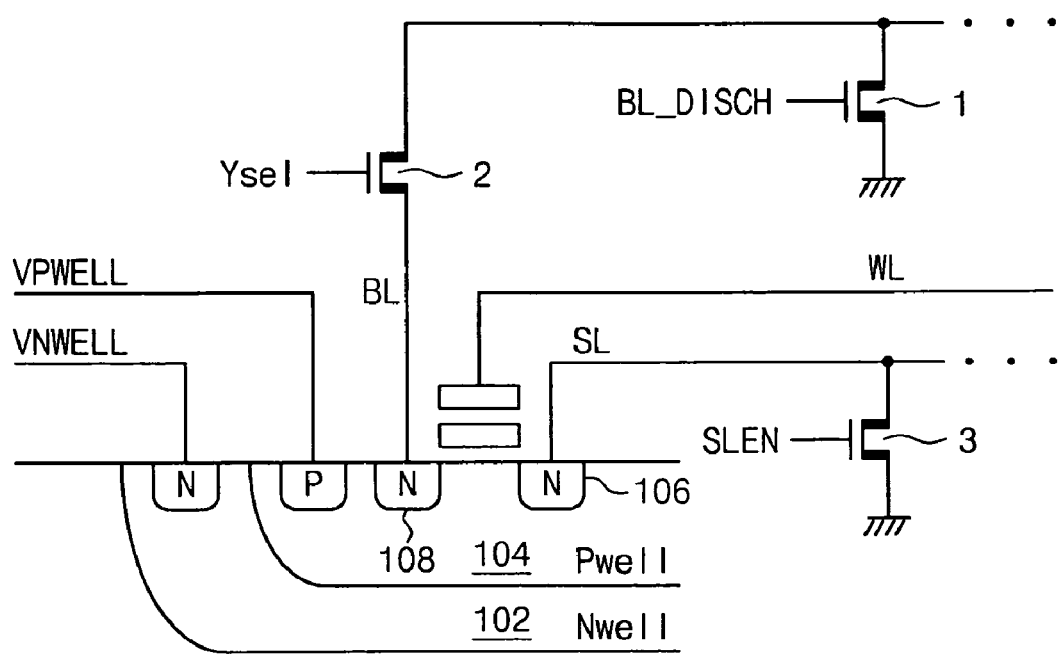
FIG. 1 is a view illustrating a portion of a flash memory structure which may be used in conjunction with an erase discharge control method according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a view illustrating a portion of a flash memory structure for implementing an erase discharge control method according to an example embodiment. It will be understood that although a flash memory device is described herein, example embodiments may be implemented in many forms of nonvolatile semiconductor memory devices in addition to flash memory.

According to an example embodiment, a bit line BL may be discharged when a word line WL voltage is discharged. To extract charges from the bit line BL, a discharge transistor 1 may be connected to the bit line BL. A drain of the discharge transistor 1 may be connected to the bit line BL, and a source may be connected to a ground Gnd. In addition, a control voltage BL_DISCH may be applied to a gate of the discharge transistor 1. The control voltage BL_DISCH may be applied to the gate of the discharge transistor 1 at the same time the word line WL beings to discharge. Thus, the discharge transistor 1 may be turned on so that the bit line BL may be grounded.

Furthermore, the discharge transistor 1 may be turned on until the discharge of a word line WL is terminated. Accordingly, the bit line BL may be discharged simultaneously with the word line WL, which may reduce or prevent an overshoot of the bit line voltage because the capacitance coupling between the word line and the bit line may have relatively little effect on the bit line voltage.

In order to discharge the bit line BL with the word line WL, a control voltage Ysel may be applied to a gate of a bit line select transistor 2 when the word line WL begins to discharge. Thus, the bit line BL may be connected to the drain of the discharge transistor 1, and simultaneously a control voltage BL_DISCH may be applied to the gate of the discharge transistor 1.

Although the discharge transistor 1 is illustrated as being provided in each bit line in FIG. 1, it may be unnecessary to select the bit line select transistor 2 when, for example, the discharge transistor 1 is provided for each local bit line of the memory array.

Figure 2:
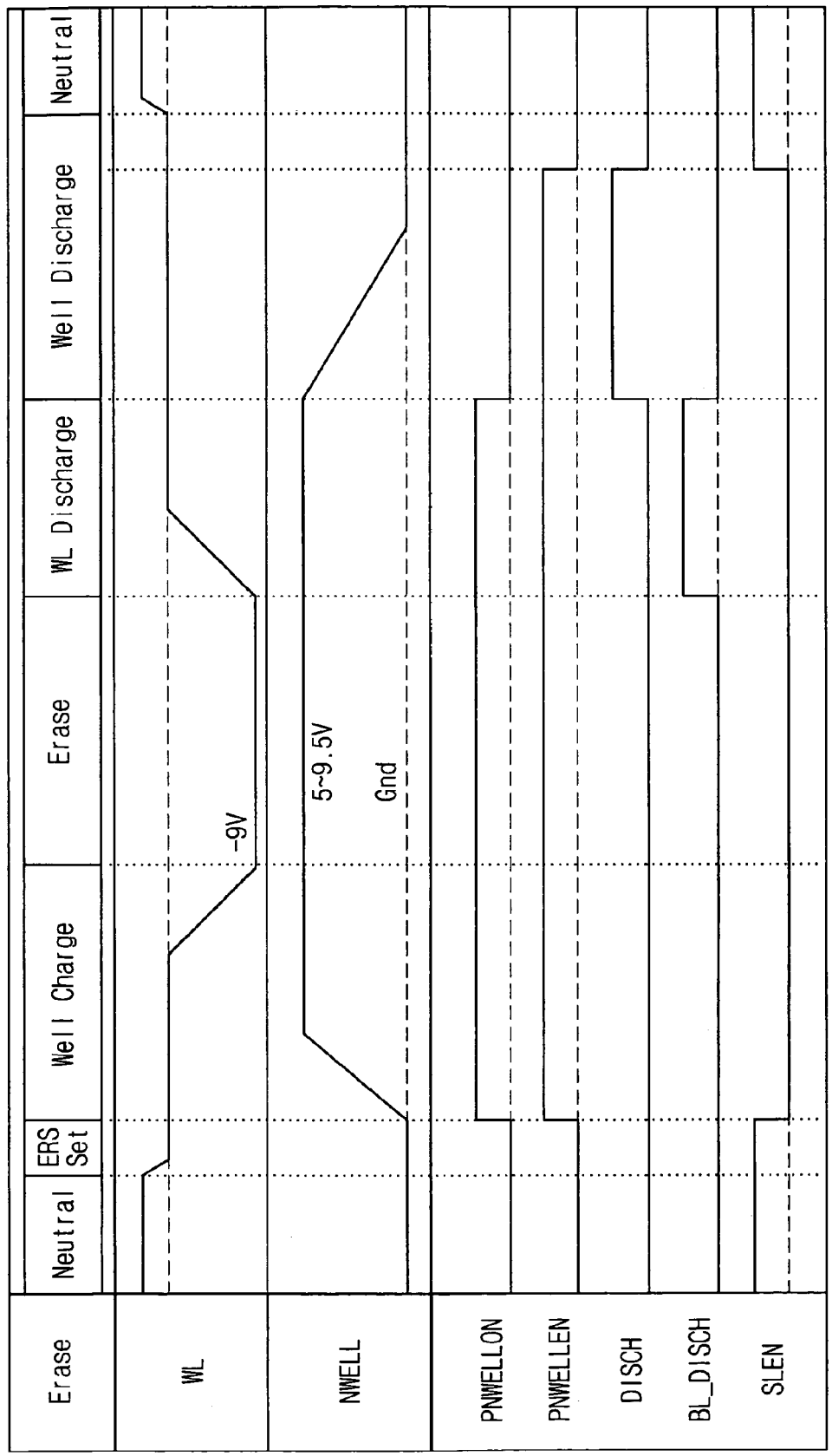
FIG. 2 is a timing diagram of applied voltages illustrating an erase discharge control method according to an example embodiment.

FIG. 2 is a timing diagram of applied voltages according to an example embodiment.

Referring to FIG. 2, turning on the discharge transistor 1 connected to the bit line may be performed simultaneously with transitioning the word line voltage to ground. However, it may also be possible to turn on the discharge transistor 1 connected to the bit line before the word line voltage is transitioned to ground.

In FIG. 2, reference symbol PNWELLON illustrates applying of a positive voltage to the P-well and the N-well, and reference symbol PNWELLEN illustrates enabling of the P-well and the N-well. Furthermore, reference symbol DISCH illustrates discharging of the P-well and the N-well, and reference symbol SLEN illustrates driving of a transistor 3 connected to a ground line SL.

Because SLEN may maintain the ground voltage level during the erase operation, the transistor 3 may be opened so that the ground line SL is opened.

Figure 3:
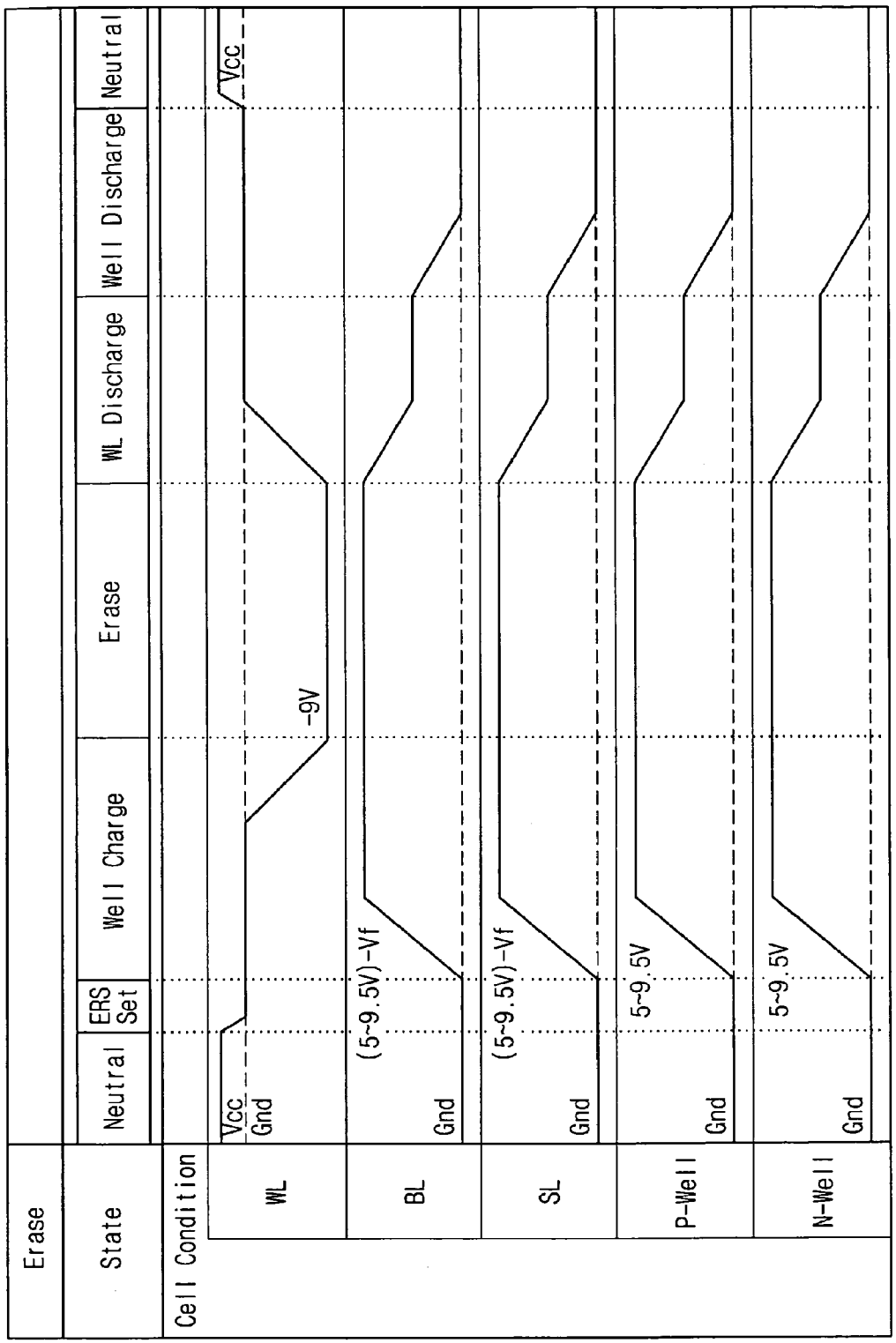
FIG. 3 is a timing diagram of applied voltages illustrating an erase discharge control method according to an example embodiment.
Figure 4:
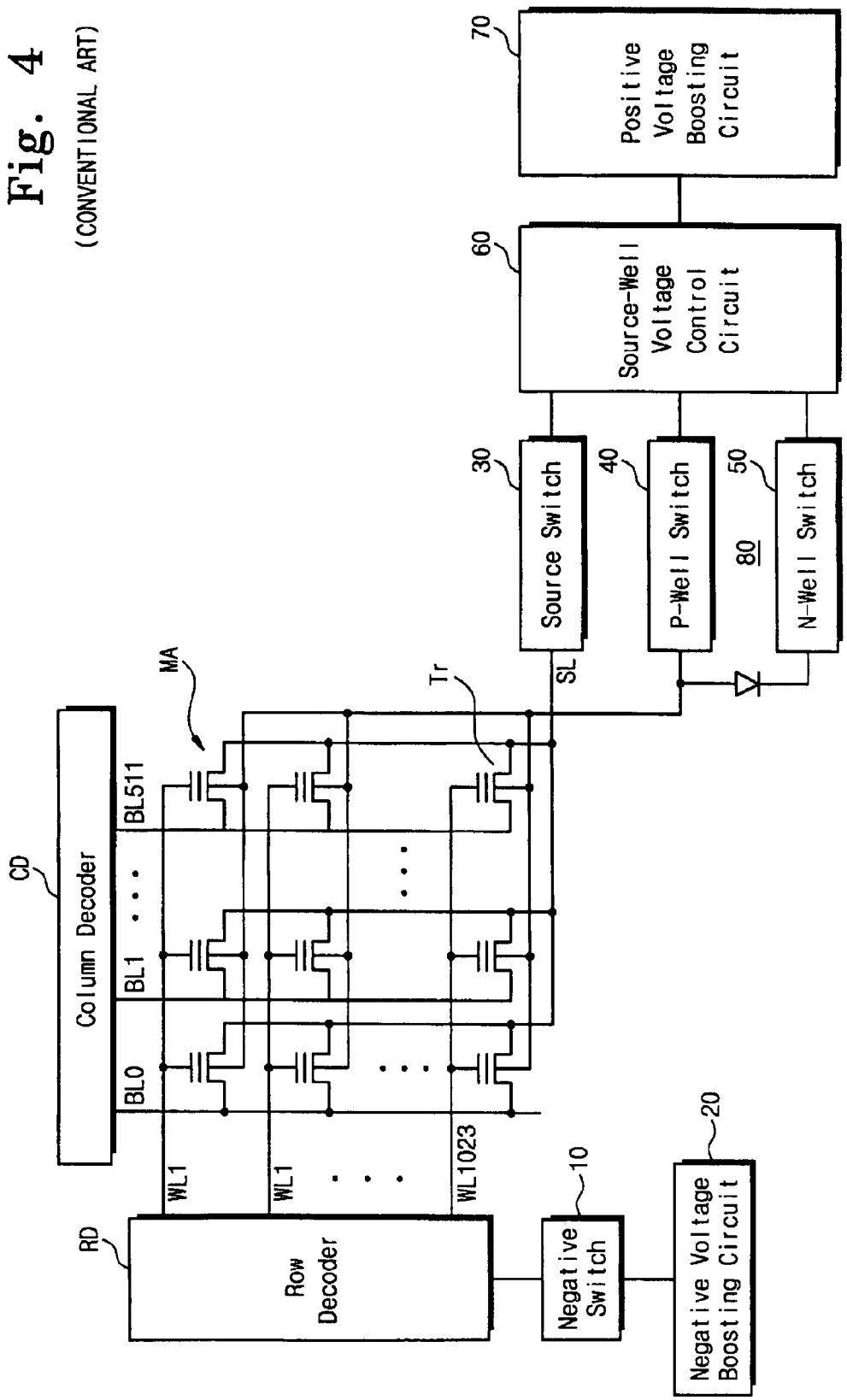
FIG. 4 is a block diagram schematically illustrating a conventional flash memory device.
Figure 5:
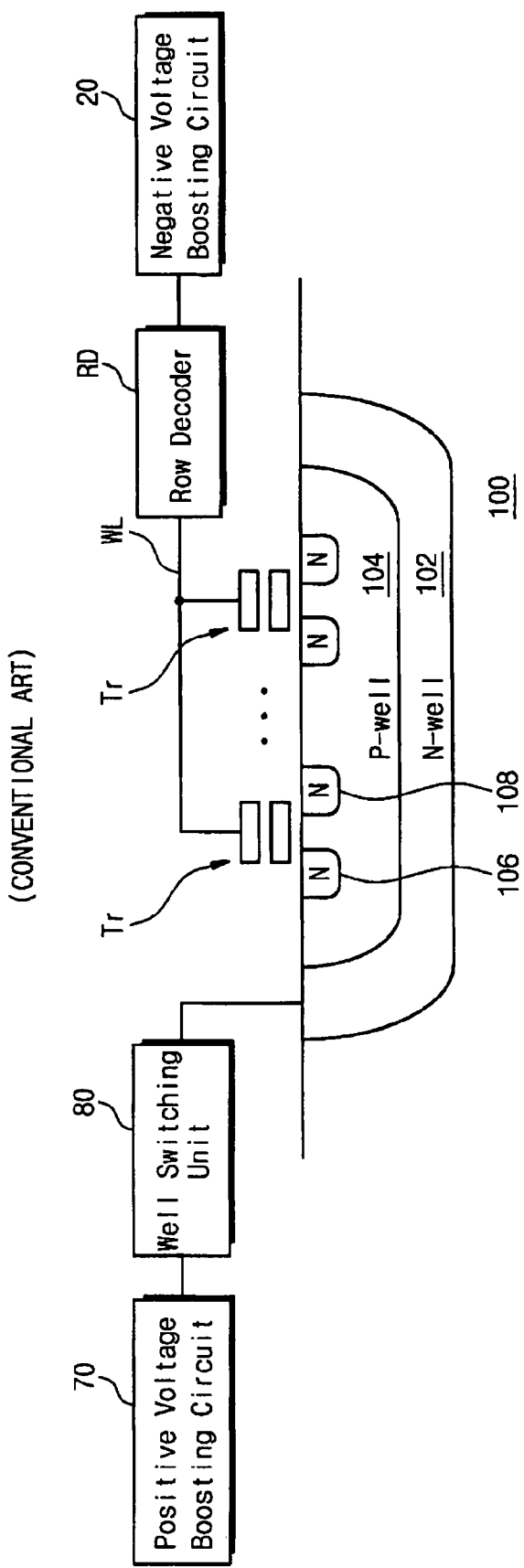
FIG. 5 is a view schematically illustrating a sectional structure of a conventional flash memory device.
Figure 6:
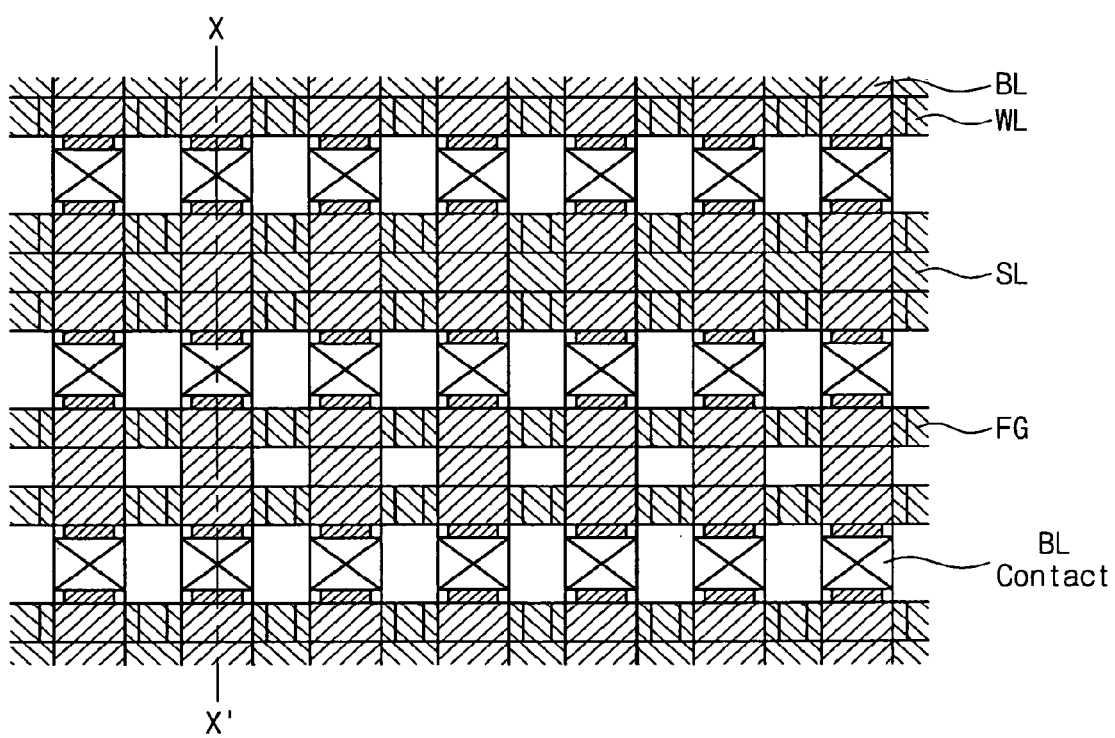
FIG. 6 is a plain view illustrating a cell array structure of a conventional flash memory device.
Figure 7:
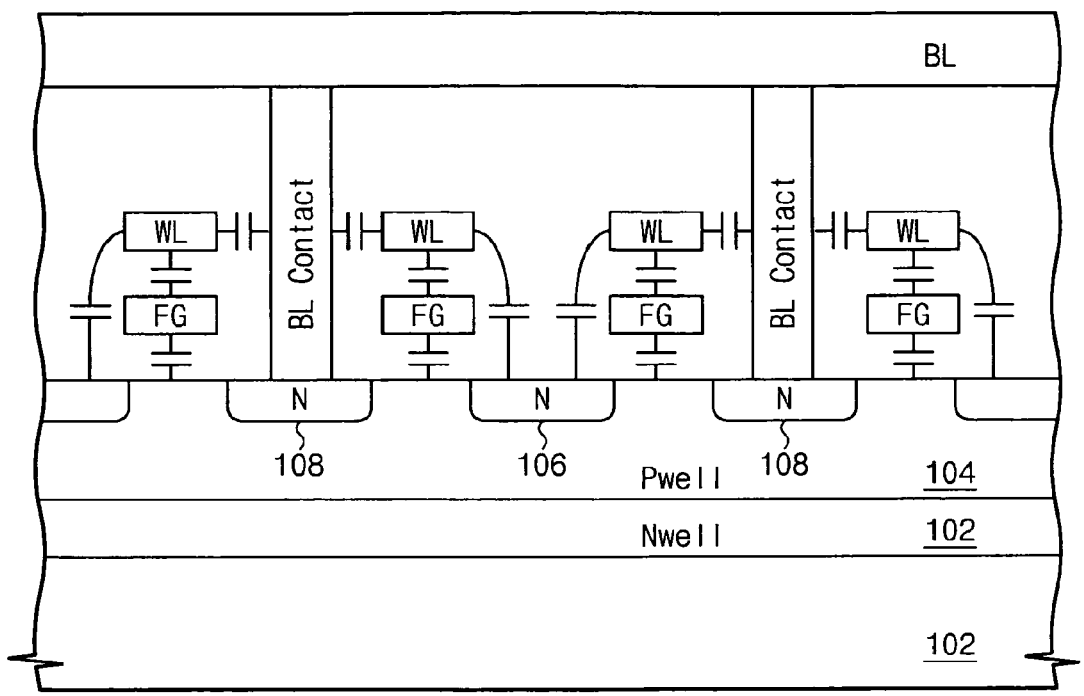
FIG. 7 is a view illustrating a sectional structure taken along line X-X' of FIG. 6.
Figure 8:
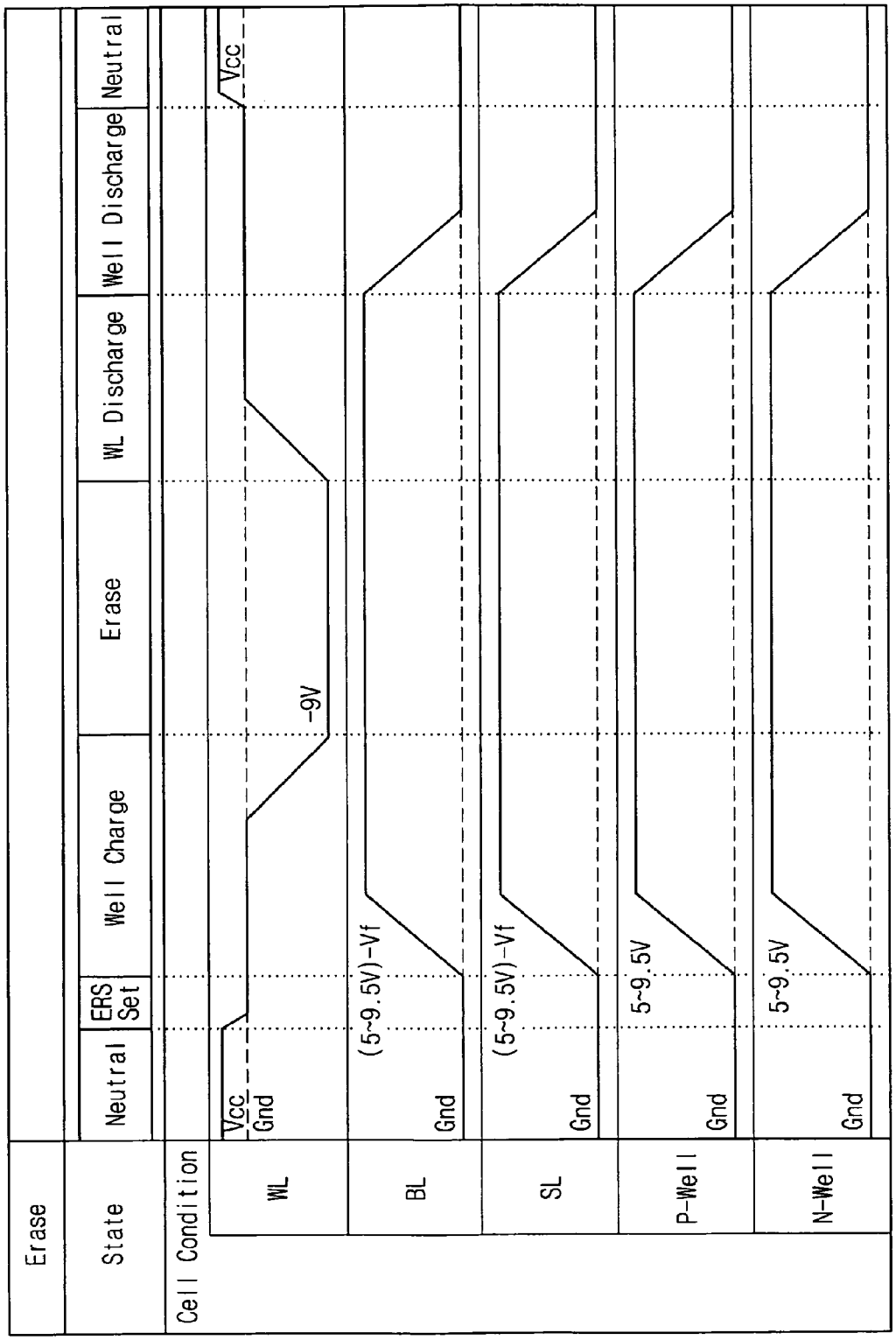
FIG. 8 is a timing diagram of applied voltages illustrating a conventional erase operation performed on the flash memory device of FIG. 4.

FIG. 3 illustrates an example timing diagram of applied voltages according to another example embodiment.

According to the example embodiment illustrated in FIG. 3, the word line may be grounded such that a positive voltage applied to the P-well and the N-well may be reduced to a voltage level lower than an erase voltage level when the word line is discharged.

Although this may lead to an increase in the bit line voltage caused by the capacitance coupling between the word line and the bit line, the bit line voltage may actually be reduced because the voltage level of the positive voltage applied to the P-well and the N-well may be lowered. Therefore, the bit line voltage may be controlled to not exceed the breakdown voltage of a component connected to the bit line.

Alternatively, voltages of the P-well and the N-well may be reduced before the word line is discharged. Thus, reducing the positive voltage applied to the P-well and the N-well may be performed simultaneously with or before the word line is discharged.

According to another example embodiment, the positive voltage applied to the P-well and the N-well may be reduced to a voltage level lower than the erase voltage level by extracting the charges from the bit line when the word line voltage is discharged. An erase discharge control may be performed to weaken the coupling between the bit line and the word line, which may impede or prevent the breakdown of a component connected to the bit line.

A flash memory device is a kind of nonvolatile memory device which may retain stored data even if a power supply is deactivated. With the increased use of mobile devices, for example, cellular phones, PDAs, portable game consoles, and MP3 players, flash memory devices may be widely used in code storage as well as data storage. In addition, flash memory may be used in home applications, for example, HDTV, DVDs, routers, and GPS devices.

Figure 9:
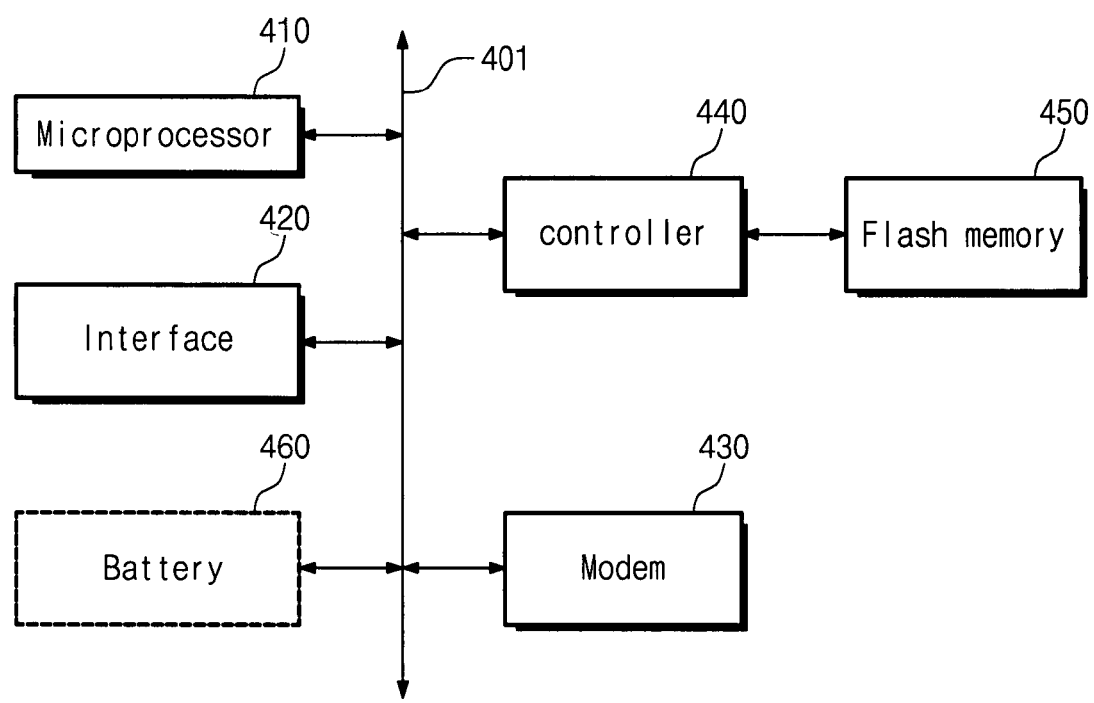
FIG. 9 is a block diagram schematically illustrating a computing system which may be used in conjunction with example embodiments.

FIG. 9 is a block diagram schematically illustrating a computing system including a flash memory device and a memory controller which may be used in conjunction with example embodiments disclosed herein.

Referring to FIG. 9, the computing system may include a microprocessor 410, a user interface 420, a modem 430 (for example, a baseband chipset or the like), a memory controller 440, and/or a flash memory device 450. The flash memory device 450 may operate based on the erase discharge control method according to above-described example embodiments. The flash memory device 450 may store N-bit data (N being a positive integer) processed/to be processed by the microprocessor 410 through the memory controller 440 (or without the memory controller). When the computing system is a mobile device, for example, a battery 460 may be additionally provided for supplying an operation voltage to the computing system. Although not shown, it will be obvious to one of ordinary skill in the art that an application chipset, a camera image processor (CIS), a mobile DRAM, etc., may be further provided in the computing system.

Because charges may be extracted from a bit line when a word line voltage is discharged, it may be possible to reduce the effect on the bit line voltage caused by the capacitance coupling between the bit line and the word line, and to reduce or remove the overshoot phenomenon of the bit line caused by the coupling accompanied by the discharge of the word line as well.

Furthermore, because the voltages of the P-well and the N-well may be reduced to a voltage level lower than an erase voltage level when the word line is discharged, the voltage applied to the bit line may be lowered in spite of the capacitance coupling between the bit line and the word line. Accordingly, the bit line voltage may not exceed a breakdown voltage of a component connected to the bit line, which may make it possible to prevent the component from being broken down.

Thus, example embodiments disclosed herein may provide an erase discharge control method of a nonvolatile semiconductor memory device, including flash memory, which may be suitable for high-speed operation without malfunction by discharging charges remaining in a memory cell, both relatively reliably and relatively quickly.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An erase discharge control method of a nonvolatile memory device including a memory array in which a plurality of cells are arranged in a matrix form, each of the cells having a floating gate type field effect transistor of which a control gate, a drain and a source are respectively connected to a word line, a bit line and a ground line, the source and drain being disposed in a P-well provided in an N-well of a semiconductor substrate, the method comprising:
    drawing charges accumulated in a floating gate of the floating gate type field effect transistor into the semiconductor substrate to perform an erase operation by applying a first voltage to the word line, a second voltage to the N-well and the P-well, and opening the bit line and the ground line;
    grounding the word line during a discharge operation, the discharge operation following the erase operation, the discharge operation discharging charge accumulated during the erase operation; and
    grounding the N-well and the P-well to discharge charges accumulated in the N-well and P-well,
    wherein a discharge transistor connected to the bit line is turned on during the discharge operation before the grounding of the word line or simultaneously with the grounding of the word line.

2. The method of claim 1, further comprising:
    reducing the second voltage applied to the N-well and the P-well to a voltage level lower than an erase voltage level.

3. The method of claim 2, wherein the reducing of the second voltage is performed before the grounding of the word line.

4. The method of claim 2, wherein the reducing of the second voltage is performed simultaneously with the grounding of the word line.

5. The method of claim 2, wherein the first voltage is a negative voltage, and the second voltage is a positive voltage.

6. An erase discharge control method of a nonvolatile memory device including a memory array in which a plurality of cells are arranged in a matrix form, each of the cells having a floating gate type field effect transistor of which a control gate, a drain and a source are respectively connected to a word line, a bit line and a ground line, the source and drain being disposed in a P-well provided in an N-well of a semiconductor substrate, the method comprising:
    drawing charges accumulated in a floating gate of the floating gate type field effect transistor into the semiconductor substrate to perform an erase operation by applying a first voltage to the word line, a second voltage to the N-well and the P-well, and opening the bit line and the ground line;
    grounding the word line during a discharge operation, the discharge operation following the erase operation, the discharge operation discharging charge accumulated during the erase operation, and discharging charges accumulated in the word line; and
    grounding the N-well and the P-well to discharge charges accumulated in the N-well and P-well,
    wherein the second voltage is reduced during the discharge operation before the grounding of the word line or simultaneously with the grounding of the word line.

7. The method of claim 6, further comprising:
    turning on a discharge transistor connected to the bit line.

8. The method of claim 7, wherein the turning on of the discharge transistor is performed before the grounding of the word line.

9. The method of claim 7, wherein the first voltage is a negative voltage, and the second voltage is a positive voltage.

10. An erase discharge control method of a nonvolatile memory device including a memory array in which a plurality of cells are arranged in a matrix form, each of the cells having a floating gate type field effect transistor of which a control gate, a drain and a source are respectively connected to a word line, a bit line and a ground line, the source and drain being disposed in a P-well provided in an N-well of a semiconductor substrate, the method comprising:
    drawing charges accumulated in a floating gate of the floating gate type field effect transistor into the semiconductor substrate to perform an erase operation by applying a first voltage to the word line, a second voltage to the N-well and the P-well, and opening the bit line and the ground line;
    grounding the word line during a discharge operation, the discharge operation following the erase operation, the discharge operation discharging charge accumulated during the erase operation; and
    grounding the N-well and the P-well to discharge charges accumulated in the N-well and P-well,
    wherein the second voltage is reduced before the grounding of the word line or simultaneously with the grounding of the word line, and
    a discharge transistor connected to the bit line is turned on during the discharge operation, before the grounding of the word line or simultaneously with the grounding of the word line.

11. The method of claim 10, wherein the first voltage is a negative voltage, and the second voltage is a positive voltage.

* * * * *